United States Patent [19]
Kimura

[11] Patent Number: 5,962,918
[45] Date of Patent: Oct. 5, 1999

[54] SEMICONDUCTOR DEVICE HAVING SIMPLE PROTECTIVE STRUCTURE AND PROCESS OF FABRICATION THEREOF

[75] Inventor: Naoto Kimura, Kumamoto, Japan

[73] Assignee: NEC Corporation, Tokyo, Japan

[21] Appl. No.: 09/170,071

[22] Filed: Oct. 13, 1998

[30] Foreign Application Priority Data

Oct. 14, 1997 [JP] Japan ................................. 9-280305

[51] Int. Cl.⁶ ................................................. H01L 23/50
[52] U.S. Cl. ........................... 257/738; 257/780; 257/784
[58] Field of Search ................................. 257/738, 777, 257/778, 784, 780, 781

[56] References Cited

U.S. PATENT DOCUMENTS

| | | | |
|---|---|---|---|
| 5,376,584 | 12/1994 | Agarwala | 257/738 |
| 5,604,379 | 2/1997 | Mori | 257/737 |
| 5,726,500 | 3/1998 | Duboz et al. | 257/738 |
| 5,753,973 | 5/1998 | Yasunaga et al. | 257/738 |
| 5,793,117 | 8/1998 | Shimada et al. | 257/780 |
| 5,834,844 | 11/1998 | Akagawa et al. | 257/738 |
| 5,844,304 | 12/1998 | Kata et al. | 257/738 |

*Primary Examiner*—David B. Hardy
*Attorney, Agent, or Firm*—McGinn & Gibb, P.C.

[57] ABSTRACT

A semiconductor integrated circuit device has a protective structure between a semiconductor chip and a ball grid array, and the protective structure has a thin polyimide film bonded to the surface of the semiconductor chip and a thick stress relaxation layer covering conductive strips connected between pads on the surface and the ball grid array; when thermal stress is exerted on the ball grid array, the thick stress relaxation layer allows said ball grid array to move so as to take up the thermal stress.

6 Claims, 14 Drawing Sheets

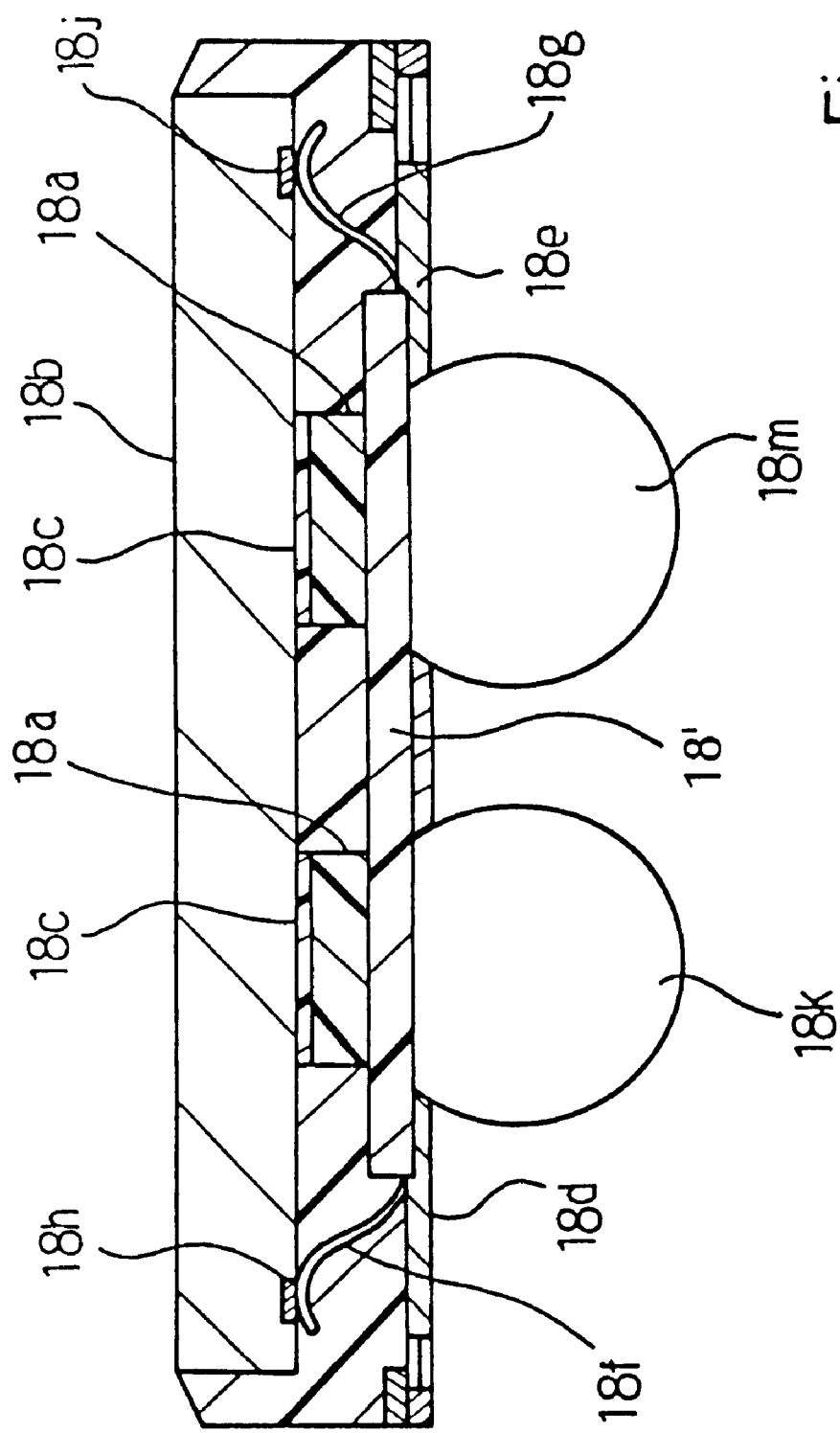

5,962,918

SEMICONDUCTOR DEVICE HAVING SIMPLE PROTECTIVE STRUCTURE AND PROCESS OF FABRICATION THEREOF

FIELD OF THE INVENTION

This invention relates to a semiconductor device and, more particularly, to a semiconductor device having a protective structure between a ball grid array and a semiconductor chip and a process of fabrication thereof.

DESCRIPTION OF THE RELATED ART

A semiconductor integrated circuit device is, by way of example, mounted on an insulating substrate. The integrated circuit is electrically connected to a conductive pattern on the rigid substrate, and the following interconnection is used between the integrated circuit and the conductive pattern.

FIG. 1 illustrates the prior art interconnection. Reference numeral 1 designates a semiconductor chip, and various circuit components (not shown) are integrated on the semiconductor chip. The circuit components are connected through internal signal lines (not shown), and form an integrated circuit. Although only one conductive pad la is shown in FIG. 1, plural conductive pads 1a are formed on the surface of the semiconductor chip 1, and electric signals are supplied to and from the integrated circuit through the conductive pads 1a.

The conductive pads 1a are connected to copper strips 2. The copper strips 2 are bent from the portion held in contact with the conductive pads 1a, and the other portions are spaced from the surface of the semiconductor chip 1. Elastomer 3 is spread over the surface of the semiconductor chip 1, and is inserted between the other portions of the copper strips 2 and the surface of the semiconductor chip 1. The elastomer layer 3 is expected to absorb thermal stress due to the difference in thermal expansion coefficient between the semiconductor chip 1 and a rigid substrate 4. The copper strips 2 and the elastomer layer 3 are covered with an insulating tape 5 of polyimide, and the copper strips 2 are exposed to holes formed in the insulating tape 5. Solder balls 6 are bonded through the holes to the copper strips 2 by means of pieces of flux, and are further bonded to a conductive pattern 7 formed on the rigid substrate 4.

The contact portion of each copper strip 2 is closer to the surface of the semiconductor chip 1 than the other portion thereof, and a recess is formed under the contact portion. Insulating sealant 8 fills the recess under each contact portion.

Another prior art semiconductor integrated circuit device has conductive pads 11 in a peripheral area of a semiconductor chip 12 as shown in FIG. 2. Copper strips 13 are held in contact with the conductive pads 11, and are bent from the contact portions so as to be spaced from the surface of the semiconductor chip 12. An elastomer layer 14 is inserted between the surface of the semiconductor chip 12 and the other portions of the copper strips 13, and the other portions of the copper strips 13 and the elastomer layer 14 are covered with a polyimide layer 15. Holes are formed in the polyimide layer 15 in such a manner that expose the copper strips 13, and solder balls 16 are bonded through the holes to the copper strips 13 by means of pieces of flux. The contact portions of the copper strips 13 are sealed in insulating sealant 17. Thus, the prior art semiconductor integrated circuit device shown in FIG. 2 has the similar structure to the prior art semiconductor integrated circuit device shown in FIG. 1 except the location of the conductive pads 11.

Yet another prior art semiconductor integrated circuit device is illustrated in FIG. 3. Elastmer sheets 18a are bonded to a semiconductor chip 18b by means of adhesive compound 18c. Conductive wiring strips 18d, 18e, 18f, 18g . . . are bonded to a synthetic resin tape 18', and predetermined conductive wiring strips 18f/18g are connected to pads 18h/18j of the semiconductor chip 18b. Small circular holes are formed in the synthetic resin tape 18', and solder balls 18k/18m are received in the holes. The solder balls 18k/18m are fixed to the conductive wiring strips 18d/18e by means of flux.

The prior art semiconductor integrated circuit device shown in FIG. 3 is fabricated through the process shown in FIGS. 4A to 4F. First, the conductive wiring strips 18d, 18e, 18f, 18g . . . are patterned on the synthetic resin tape. The conductive wring strips 18d, 18e, 18f, 18g . . . form a conductive wiring pattern 18n, and the conductive wiring pattern 18n extends over an elliptical hole 18p formed in the synthetic resin tape 18'. Subsequently, the elastomer sheets 18a are bonded to the synthetic resin tape 18' at interval, and are spaced from each other by the elliptical hole 18p as shown in FIG. 4A.

Subsequently, the adhesive compound 18c is spread over the exposed surfaces of the elastmer sheets 18a, and the semiconductor chip 18b is bonded to the elastmer sheets 18a as shown in FIG. 4B.

The manufacturer turns the synthetic resin tape 18' over, and small circular recesses 18q are exposed. A bonding tool 18r selectively presses the conductive wiring pattern 18n against bonding pads of the semiconductor chip 18b as shown in FIG. 4C. The predetermined conductive wiring strips 18f/18g are bent toward the semiconductor chip 18b, and are thermally bonded to the bonding pads 18h/18j of the semiconductor chip 18b.

Subsequently, a dispenser 18s is moved along the elliptical hole 18p, and liquid epoxy resin flows from the dispenser 18s into the elliptical hole 18p as shown in FIG. 4D. The liquid epoxy resin seals the conductive wiring pattern 18n in the elliptical hole 18p, and is solidified to an epoxy resin layer as shown in FIG. 4E.

Finally, flux is supplied to the conductive wiring pattern 18n exposed to the small circular holes 18q, and the solder balls 18k/18m are inserted into the small circular holes 18q. The flux bonds the solder balls 18k/18m to the conductive wiring pattern 18n as shown in FIG. 4F.

A problem is encountered in the prior art semiconductor integrated circuit device in the production cost. Especially, the elastomer layers 3/14 and the elastomer sheets 18a are so expensive that the manufacturer suffers from high production cost of the prior art semiconductor integrated circuit devices. When the manufacturer uses the synthetic resin tape with the conductive wiring pattern 18n, the production cost is further increased. Each elastomer sheet is 10 yen, and the synthetic resin tape with the conductive wring pattern is of the order of 50 yen. The adhesive compound between the synthetic resin tape 18f and the elastomer sheets 18a is 1 yen per each elastomer sheet.

SUMMARY OF THE INVENTION

It is therefore an important object of the present invention to provide a semiconductor device which is low in production cost.

It is also an important object of the present invention to provide a process for fabricating the semiconductor device.

To accomplish the objects, the present invention proposes to space solder balls from a semiconductor chip without an elastomer sheet so as to take up thermal stress.

In accordance with one aspect of the present invention, there is provided a semiconductor device comprising a semiconductor chip having electric elements connected to conductive pads formed on a major surface thereof, an insulating layer covering the major surface and having holes to which the conductive pads are exposed, conductive strips formed on the insulating layer and having first portions respectively connected to the conductive pads, a stress relaxation layer thicker than the protective insulating layer, covering the conductive strips and having holes to which second portions of the conductive strips are exposed and solder balls received in the holes in the stress relaxation layer and soldered to the second portions, respectively.

In accordance with another aspect of the present invention, there is provided a process for fabricating a semiconductor device, comprising the steps of preparing a semiconductor chip having electric elements connected to conductive pads formed on a major surface thereof, covering the major surface with an insulating layer having holes to which the conductive pads are exposed, patterning conductive strips on the insulting layer in such a manner as to have first portions connected to the conductive pads, respectively, covering the resultant structure of the previous step with a stress relaxation layer thicker than the protective insulating layer except second portions of the conductive strips, and soldering solder balls to the second portions.

BRIEF DESCRIPTION OF THE DRAWINGS

The features and advantages of the semiconductor integrated circuit device will be more clearly understood from the following description taken in conjunction with the accompanying drawings in which:

FIG. 3 is a cross sectional view showing the structure of yet another prior art ball grid array semiconductor integrated circuit device;

DESCRIPTION OF THE PREFERRED EMBODIMENTS

Structure of Semiconductor Integrated Circuit Device

Figure 1:
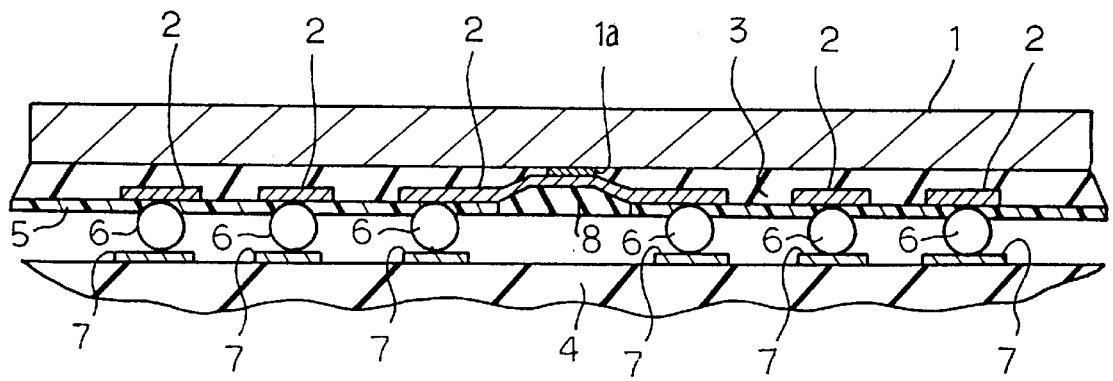
FIG. 1 is a cross sectional view showing the structure of the prior art ball grid array semiconductor integrated circuit device.
Figure 2:
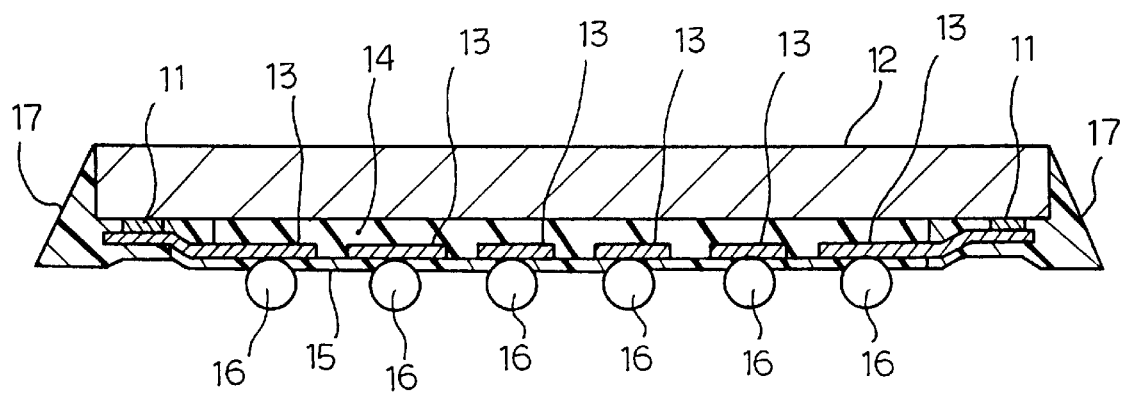
FIG. 2 is a cross sectional view showing the structure of another prior art ball grid array semiconductor integrated circuit device.
Figure 4A:
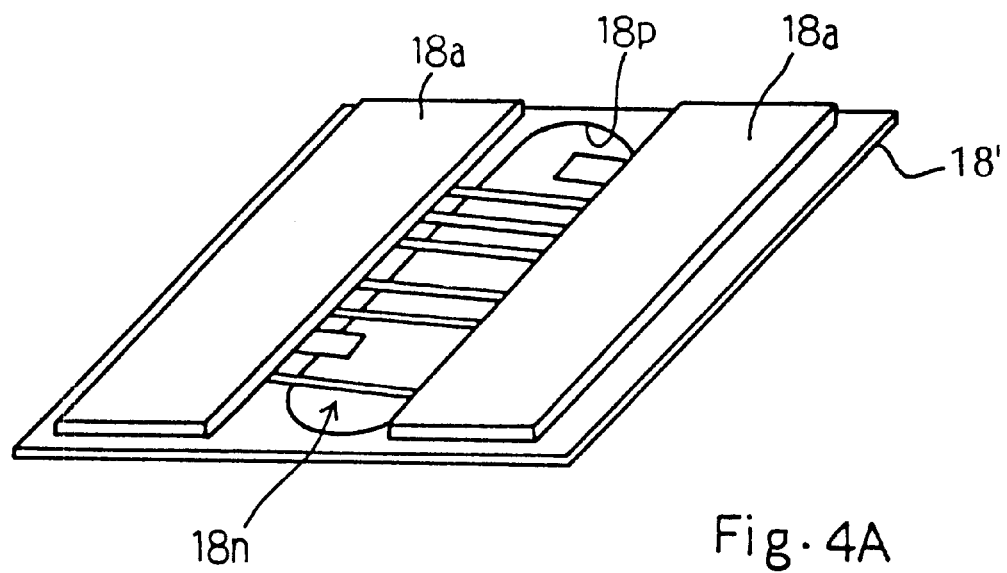
FIGS. 4A to 4F are cross sectional views showing the prior art process for fabricating the ball grid array semiconductor integrated circuit device.
Figure 4B:
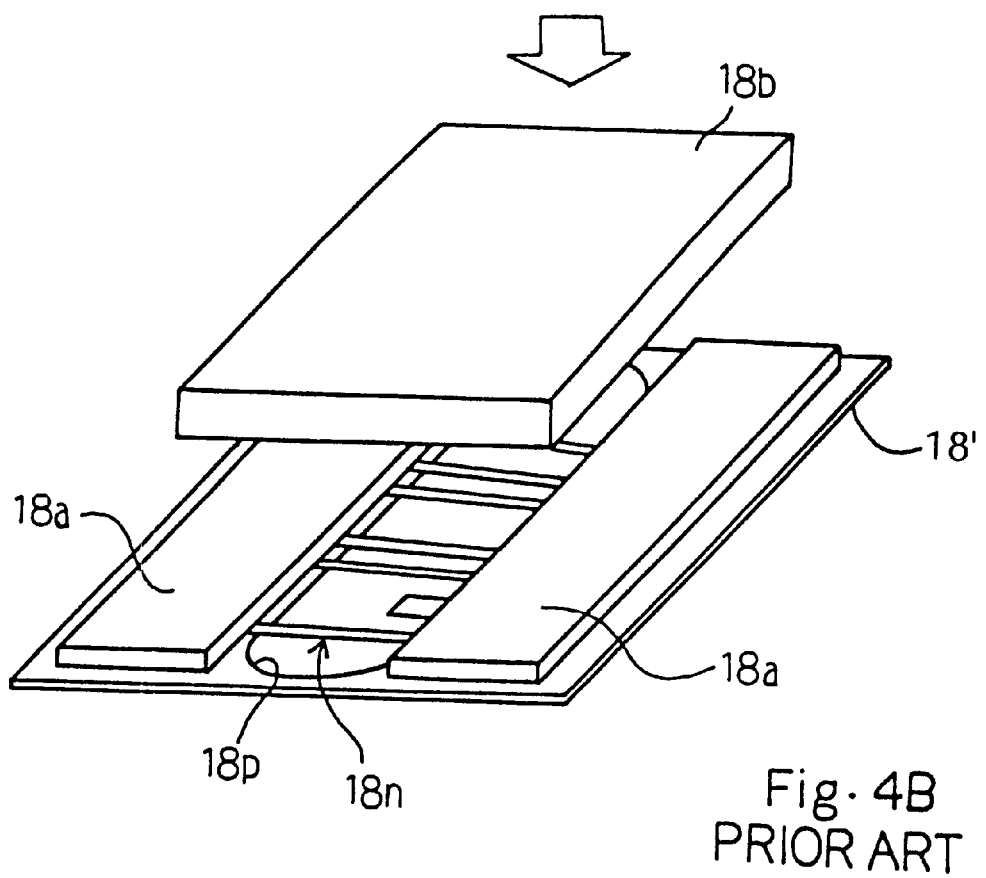
Figure 4C:
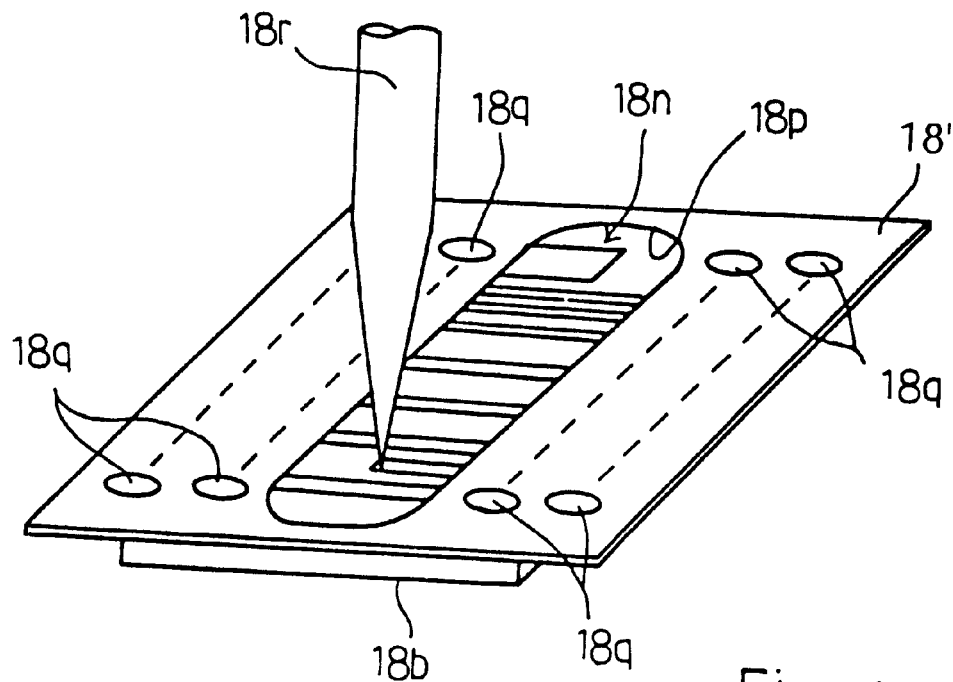
Figure 4D:
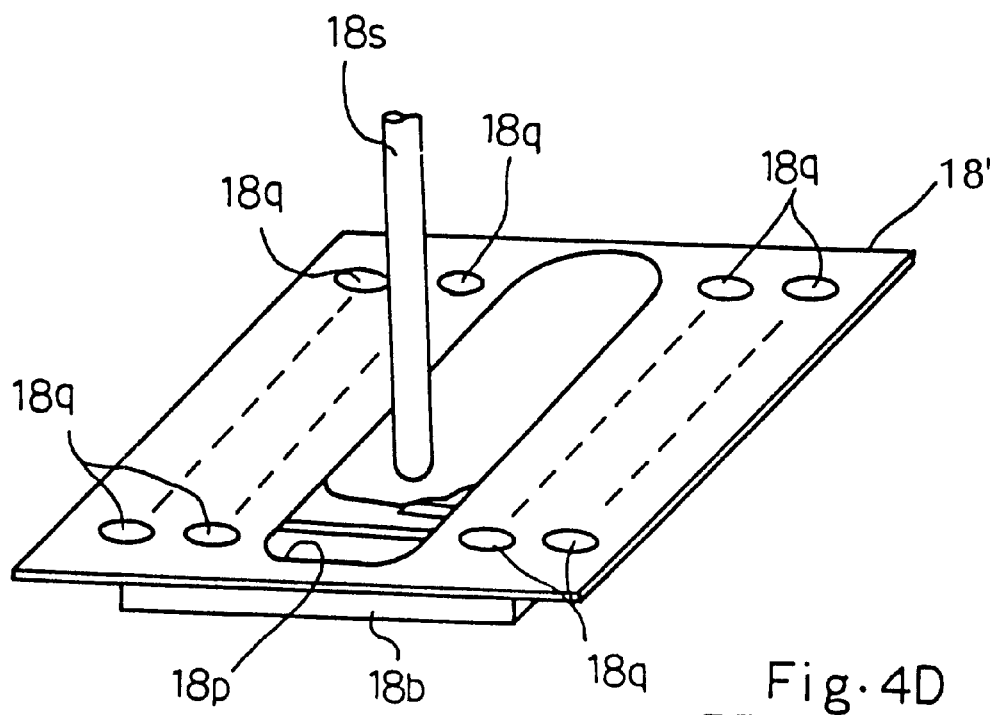
Figure 4E:
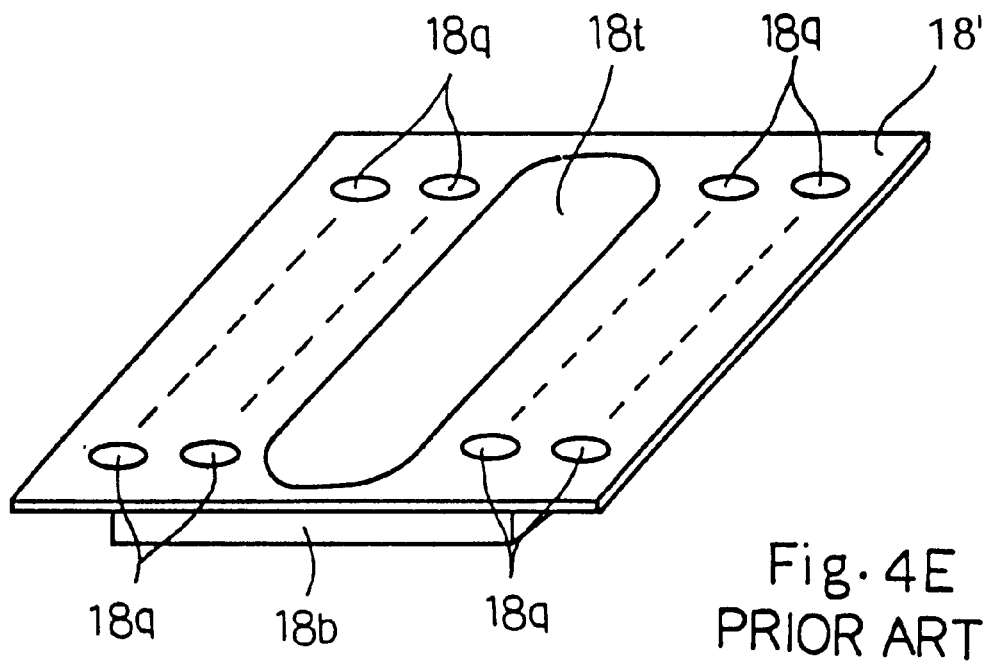
Figure 4F:
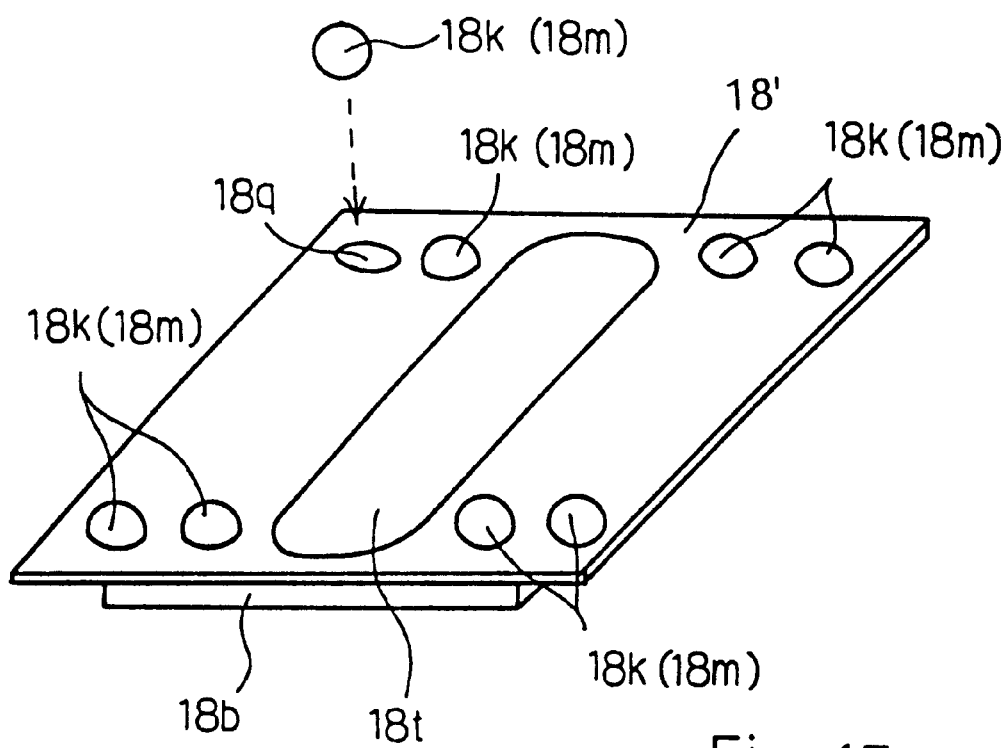
Figure 5:
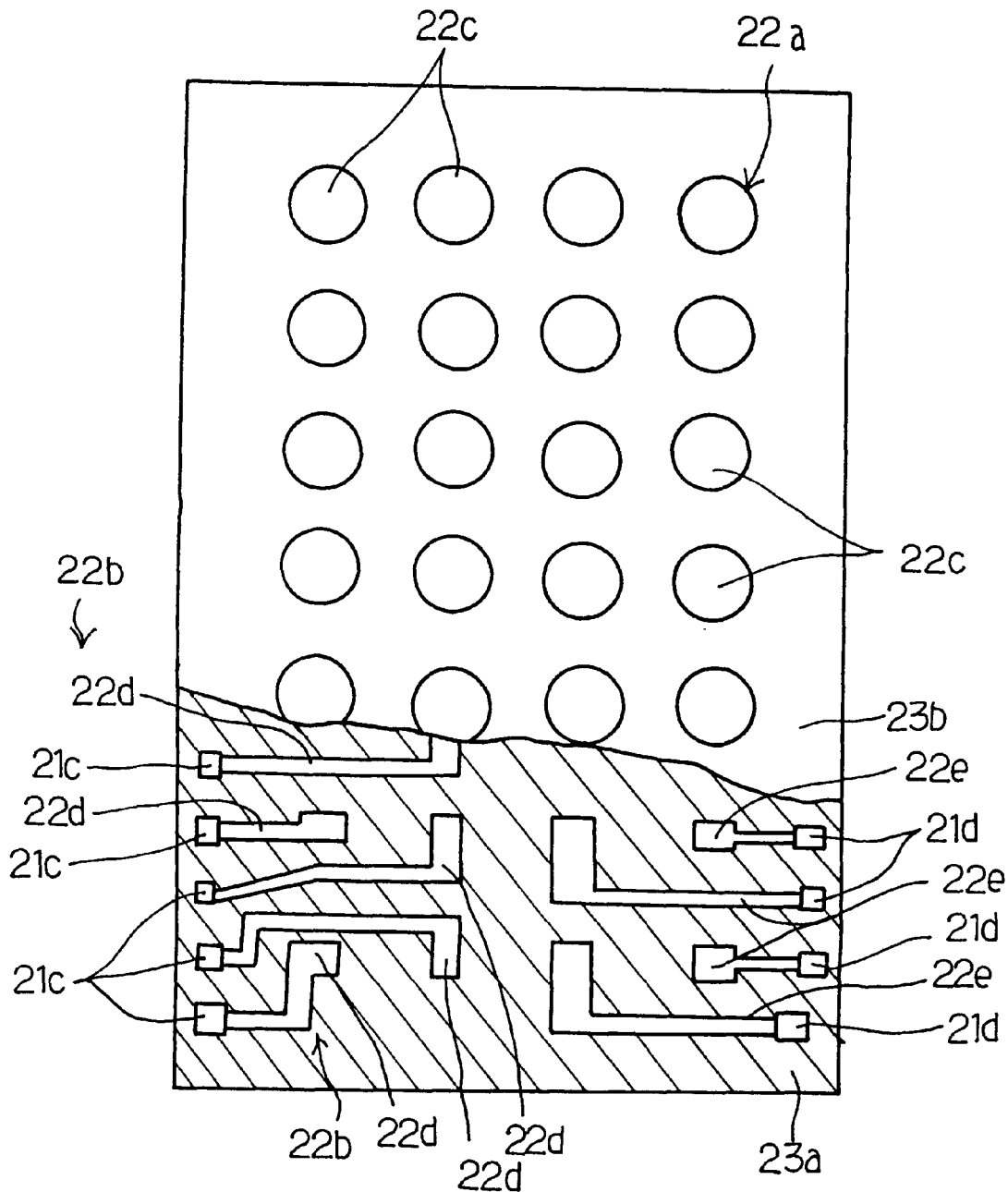
FIG. 5 is a plane view showing a ball grid array and a conductive strip pattern incorporated in a semiconductor integrated circuit device according to the present invention.
Figure 6:
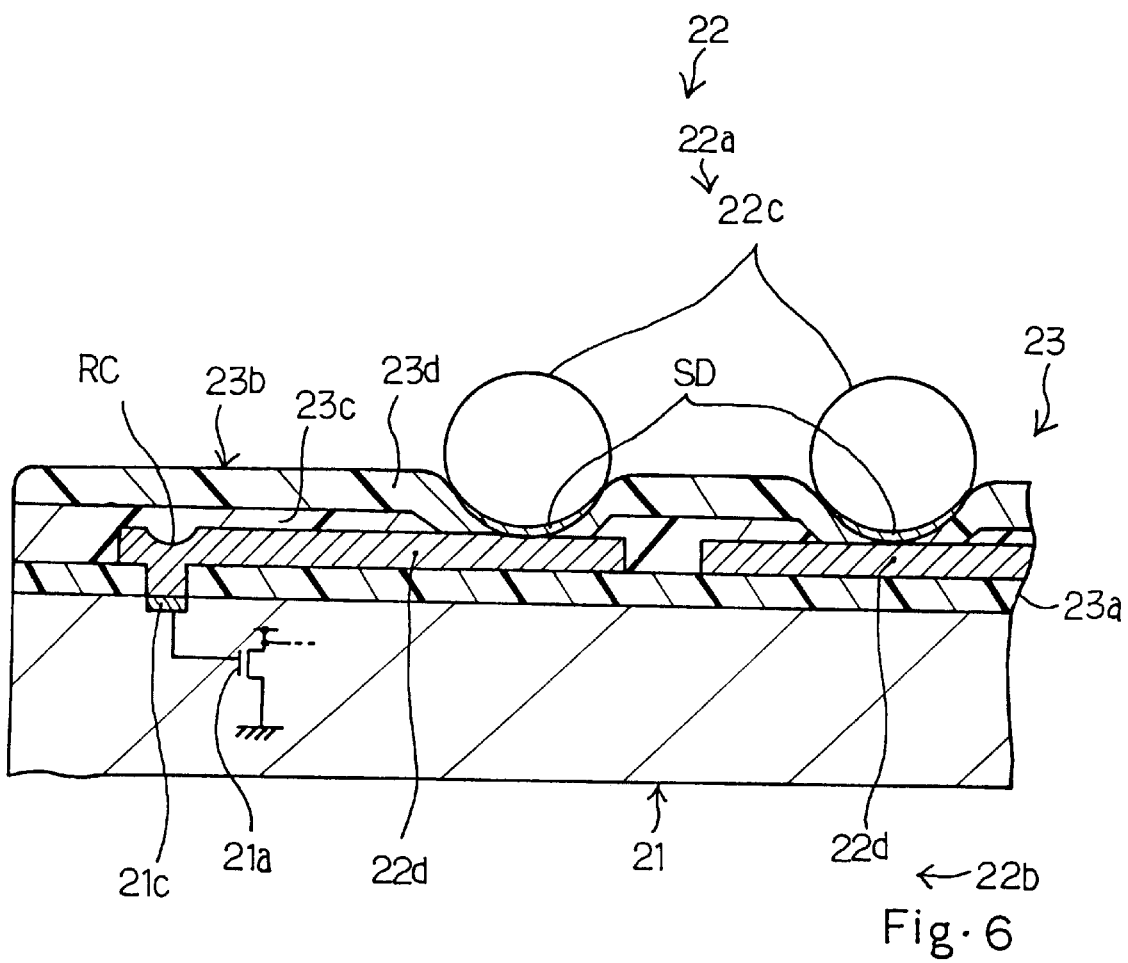
FIG. 6 is a cross sectional view showing the structure of the semiconductor integrated circuit device.

FIGS. 5 and 6 illustrate a semiconductor integrated circuit device embodying the present invention. In FIG. 5, the semiconductor integrated circuit device is partially cut away so as to clearly understand the inside under a ball grid array.

The semiconductor integrated circuit device largely comprises a semiconductor chip 21, an interconnection 22 and a protective structure 23. Plural circuit components such as, for example, input transistors 21a are fabricated on a semiconductor substrate, and form in combination an integrated circuit. The semiconductor substrate, a multi-layered conductive pattern, a multi-layered inter-level insulating structure and a passivation layer as a whole constitute the semiconductor chip 21. The integrated circuit is connected to conductive pads 21c/21d, and the conductive pads 21c/21d are patterned on peripheral areas of a surface on both sides of the semiconductor chip 21.

The interconnection 22 includes a ball grid array 22a and a conductive strip pattern 22b. Solder balls 22c are arranged in rows and columns over the semiconductor chip 21, and form the ball grid array 22a. The conductive strip pattern 22b includes plural conductive strips 22d/22e connected between the conductive pads 21c/21d and the solder balls 22c, respectively, and the conductive strips 22d/22e are separated from a lead frame. The conductive strips 22d/22e are, by way of example, formed of copper, aluminum or copper laminated on titanium-tungsten. The conductive pads 21c/21d are exposed to holes, and the holes are causative of recesses RC formed in the conductive strips 22d/22e. The conductive strips 22d/22e allow a manufacturer to arrange the solder balls 22c over the entire surface of the semiconductor chip 21.

The protective structure 23 includes an insulating layer 23a and a stress relaxation layer 23b. The insulating layer 23a is formed of polyimide, and provides electrically isolation between the conductive strips 22d/22e and the conductive pads 21c/21d. Holes are formed in the isolating layer 23a, and the conductive pads 21c/21d are exposed to the holes in the isolating layer 23a. The conductive strips 22d/22e extend on the isolating layer 23a from the conductive pads 21c/21d to the solder balls 22c.

The stress relaxation layer 23b includes a covering layer 23c of polyimide and a spacer layer 23d of epoxy resin. The conductive strips 22d/22e are not strongly adhered to the polyimide, and, for this reason, are sandwiched between the insulating layer 23a and the covering layer 23c so as not to peel from the insulting layer 23a. The insulating layer 23a is hatched in FIG. 5 so as to be easily discriminated from the stress relaxation layer 23b. In this instance, the covering layer 23c is 10 microns thick, and the spacer layer 23d is 100 microns thick. Thus, the surface of the semiconductor chip 21 is covered with the insulating layer 23a, and the insulating layer 23a isolates the conductive strips 22d/22e thereon from one another.

The conductive strip pattern 22b and the protective layer 23a are covered with the stress relaxation layer 23b. The covering layer 23c and the spacer layer 23d are partially removed so that the conductive strips 22d/22e are exposed to holes formed in the stress relaxation layer 23b. The solder balls 22c are received in the holes, and are bonded to the conductive strips 22d/22e by means of solder layers such as, for example, lead-tin alloy SD. The total thickness of the stress relaxation layer 23b is 110 microns, and the stress relaxation layer 23b widely spaces the solder balls 22c from the conductive strips 22d/22e. When thermal stress is exerted on the solder balls 22c due to difference in thermal expansion coefficient between the semiconductor chip 21 and a rigid substrate (not shown), the solder layers SD are slightly deformed so as to allow the solder balls 22c to laterally move in the holes formed in the stress relaxation layer 23b. Moreover, the stress relaxation layer 23b are thick enough to allow the solder balls 22c to widely move under a small declining angle of the stress relaxation layer 23b. Thus, the solder layers SD and the thick stress relaxation layer 23b take up the thermal stress.

As will be understood from the foregoing description, the conductive strips 22d/22e are patterned on the polyimide layer 23a, and the solder layers SD, the covering layer 23c and the spacer layer 23d take up the thermal stress without an elastomer layer. As a result, the production cost is surely reduced.

The covering layer 23c is thick enough to make the upper surface thereof flat, and no sealant is required for the semiconductor integrated circuit device.

Fabrication Process

Figure 7A:
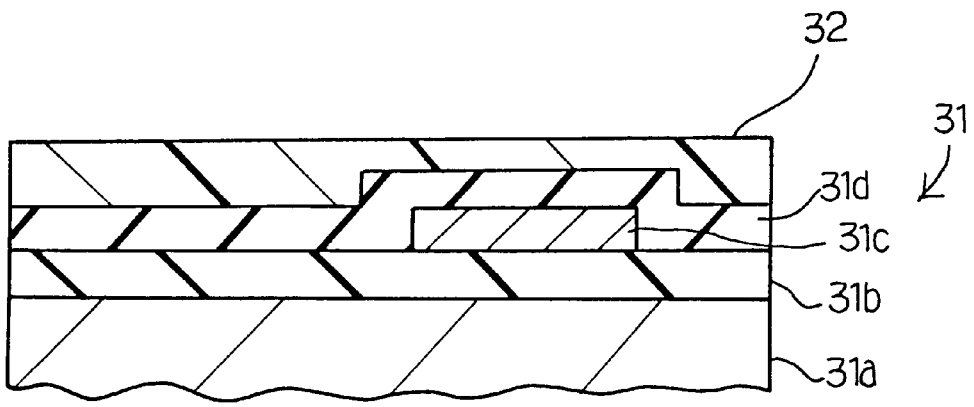
FIGS. 7A to 7O are cross sectional views showing a process for fabricating the semiconductor integrated circuit device.
Figure 7B:
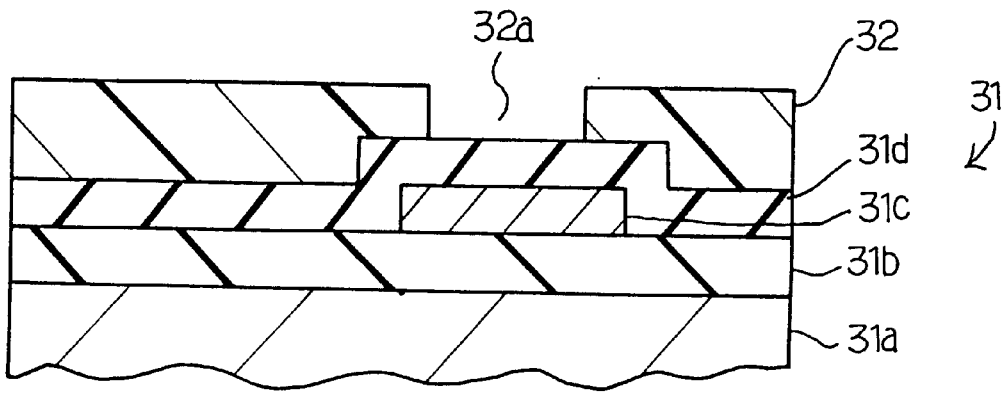
Figure 7C:
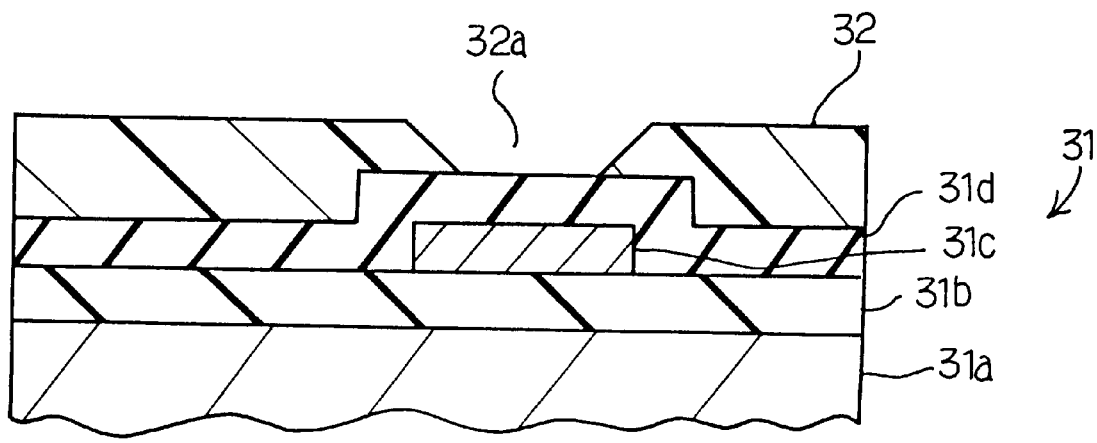
Figure 7D:
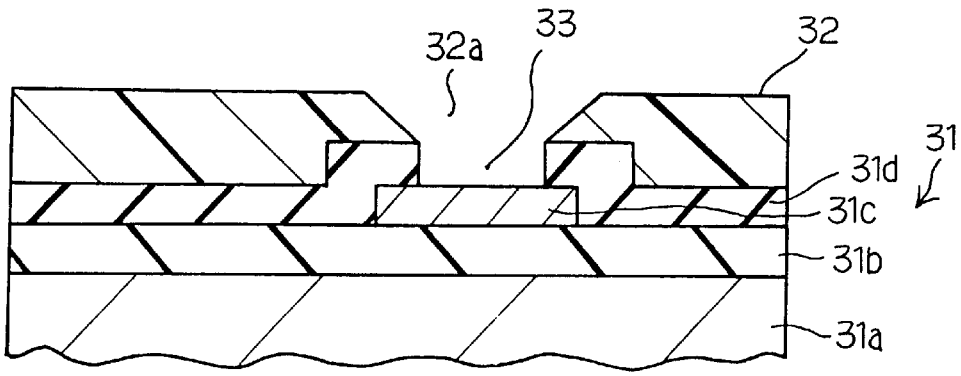
Figure 7E:
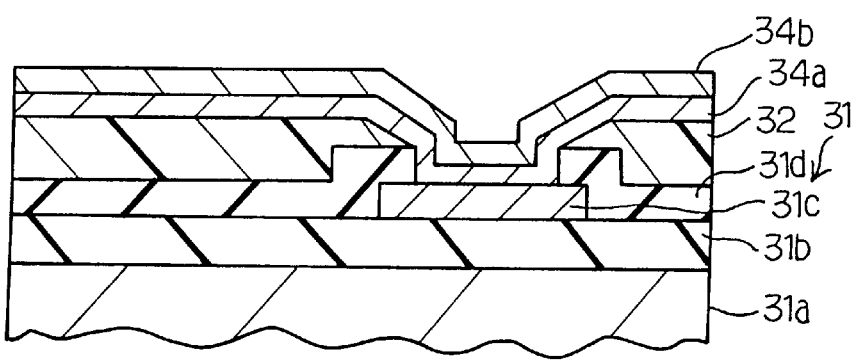
Figure 7F:
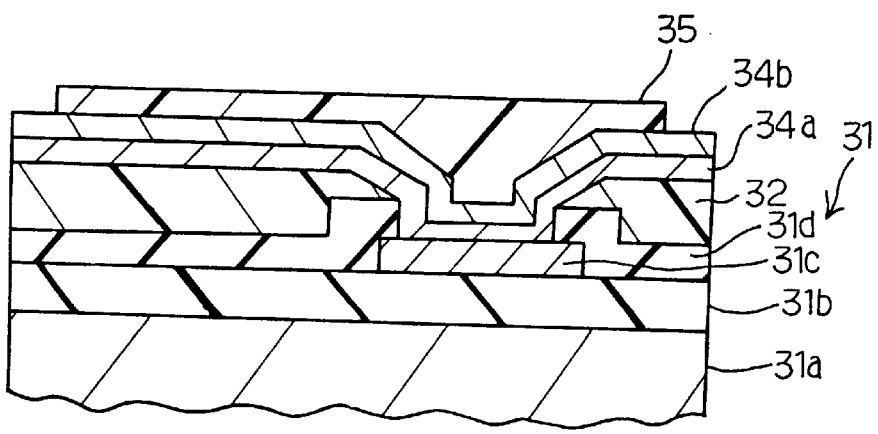
Figure 7G:
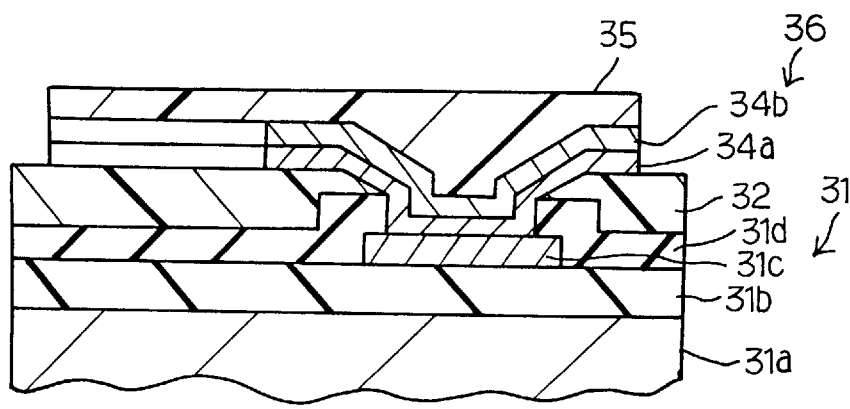
Figure 7H:
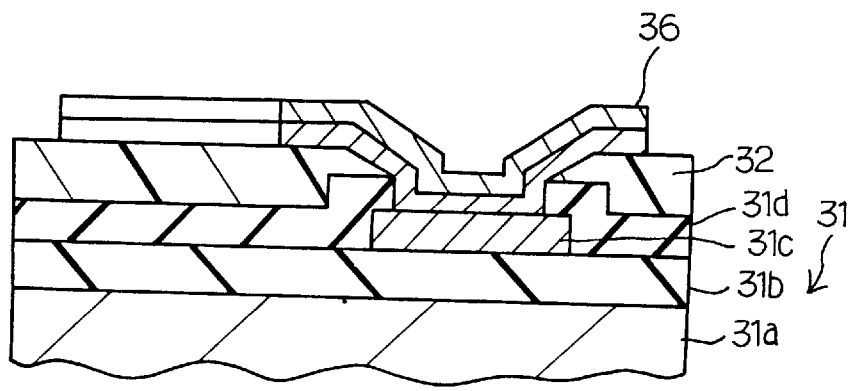
Figure 7I:
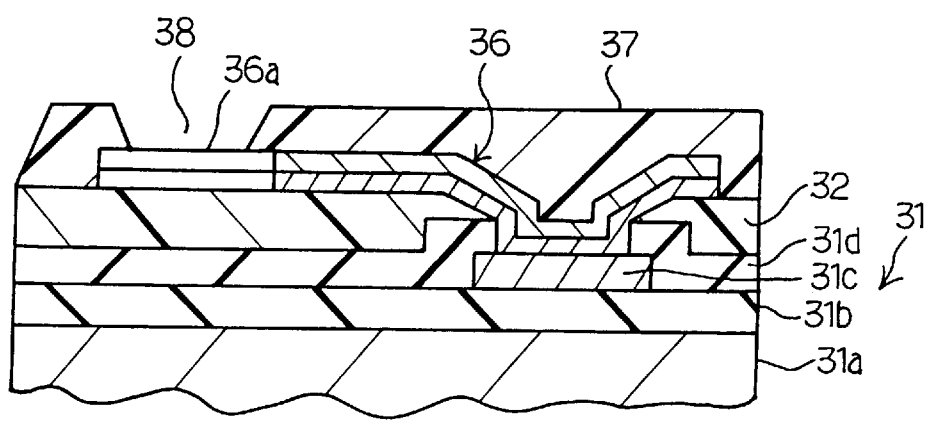

The semiconductor integrated circuit device shown in FIGS. 5 and 6 is fabricated as follows. FIGS. 7A to 7O illustrate a process for fabricating the semiconductor integrated circuit device according to the present invention.

The process starts with preparation of a semiconductor wafer 31 where the integrated circuit devices have been already fabricated. In this instance, the semiconductor wafer 31 includes an original semiconductor wafer 31a, an inter-level insulating layer 31b grown on the original semiconductor wafer 31a, conductive pads 31c patterned on the inter-level insulating layer 31b and a passivation layer of titanium nitride covering the conductive pads 31c. Although the semiconductor integrated circuit device has the plural conductive pads 31c and the plural solder balls, description is focused on one of the conductive pads 31c and one of the solder balls. One of the conductive pad 31c is corresponding to the conductive pad 21c shown in FIG. 6. Photo-sensitive polyimide 32 is spread over the semicnductor wafer 31 as shown in FIG. 7A.

Subsequently, a pattern image for a contact hole is transferred from a photo-mask to the photo-sensitive polyimide layer 32, and forms a latent image in the photo-sensitive polyimide layer 32. The photo-sensitive polyimide layer 32 is treated with organic solvent, and a contact hole 32a is formed in the photo-sensitive polyimide layer 32 as shown in FIG. 7B. The photo-sensitive polyimide layer 32 is baked so as to be reflowed as shown in FIG. 7C.

Using the photo-sensitive polyimide layer 32 as an etching mask, the passivation layer 31d is selectively etched away, and a contact hole 33 is formed in the passivation layer 31d. The conductive pad 31c is exposed to the contact hole 33 as shown in FIG. 7D. The photo-sensitive polyimide layer is corresponding to the insulating layer 23a shown in FIG. 6.

Titanium tungsten (Ti—W) alloy is deposited to 2000 angstroms thick over the entire surface of the resultant structure by using a sputtering, and copper is also deposited to 3 microns thick over the titanium tungsten alloy layer 34a by using a sputtering. The titanium tungsten alloy layer 34a and the copper layer 34b conformably extend on the resultant structure as shown in FIG. 7E.

Photo-resist solution is spread over the entire surface of the copper layer 34b, and is baked so that a photo-resist layer covers the copper layer 34b. A pattern image for a conductive wiring pattern is transferred from a photo mask to the photo-resist layer, and forms a latent image in the photo-resist layer. The latent image is developed so as to form a photo-resist etching mask 35 from the photo-resist layer as shown in FIG. 7F.

Using the photo-resist etching mask 35, the copper layer 34b and the titanium tungsten alloy layer 34a are selectively removed by using a wet etching technique. Thus, the lamination of the titanium tungsten alloy layer 34a and the copper layer 34b is patterned into the conductive wiring strip 36 as shown in FIG. 7G. The photo-resist etching mask 35 is stripped off (see FIG. 7H), and photo-sensitive polyimide is spread over the entire surface of the resultant structure, and forms a photo-sensitive polyimide layer 37 of 10 microns thick. A pattern image is transferred from a photo mask to the photo-sensitive polyimide layer 37, and forms a latent image in the photo-sensitive polyimide layer 37. The photo-sensitive polyimide is selectively removed by using the organic solvent, and a contact hole 38 is formed in the photo-sensitive polyimide layer 37. A land portion 36a of the conductive wiring pattern 36 is exposed to the contact hole 38, and is assigned to one of the solder balls. The photo-sensitive polyimide layer 37 is reflowed, and serves as the covering layer 23c (see FIG. 7I).

Figure 7J:
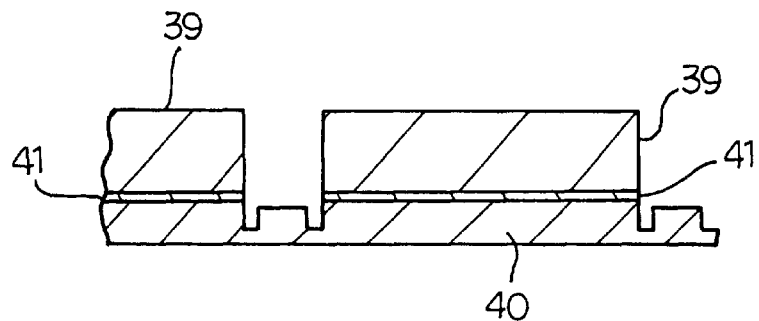
Figure 7K:
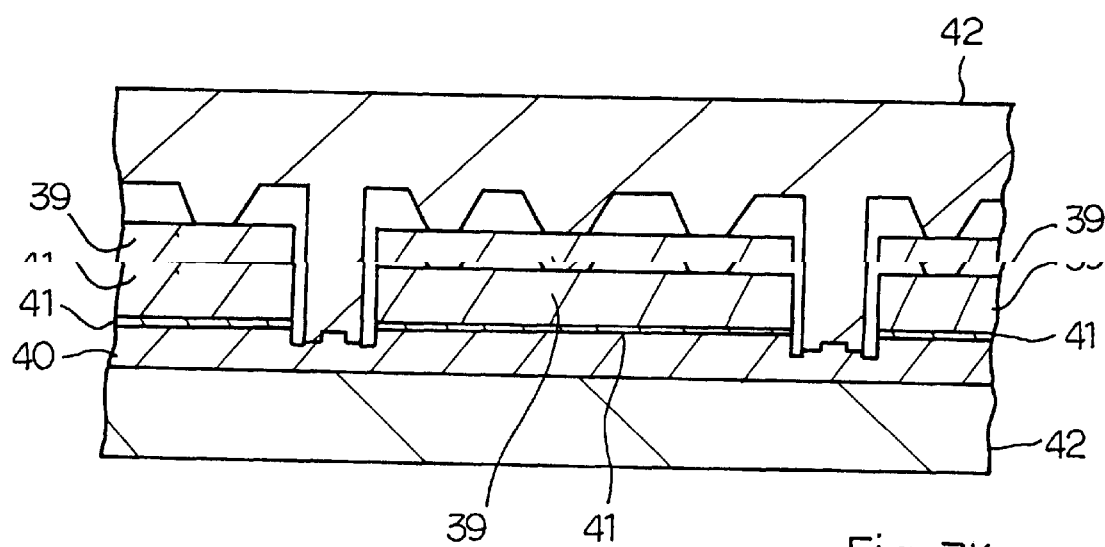

The semiconductor wafer 31 is separated into semiconductor chips 39, and the semiconductor chips 39 are bonded to a lead frame 40 by using silver paste 41 as shown in FIG. 7J. Thus, the semiconductor chips 39 are assembled with the lead frame 40. The semiconductor chips 39 mounted on the lead frame 40 is placed in a transfer molding die 42 as shown in FIG. 7K, and epoxy resin is injected into the transfer molding die 42.

Figure 7L:
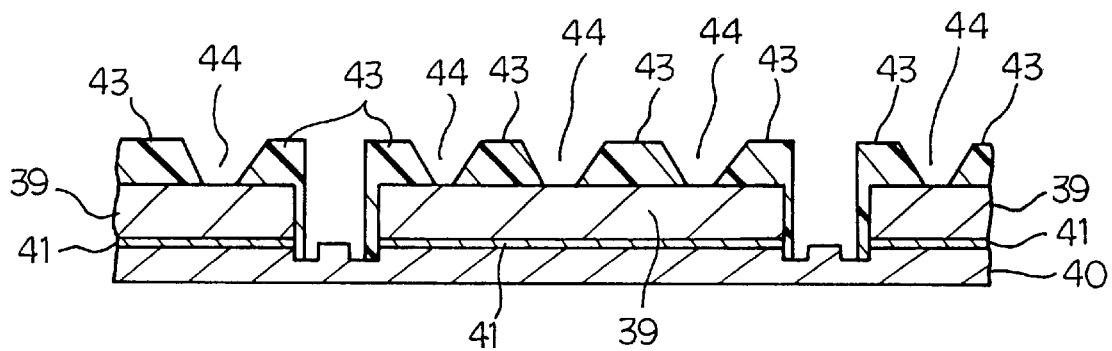

The semiconductor chips 39 on the lead frame 40 is taken out from the transfer molding die 42 (see FIG. 7L). The epoxy resin 43 serves as the spacer layer 23d, and has holes 44 each nested in the contact hole 38.

Figure 7M:
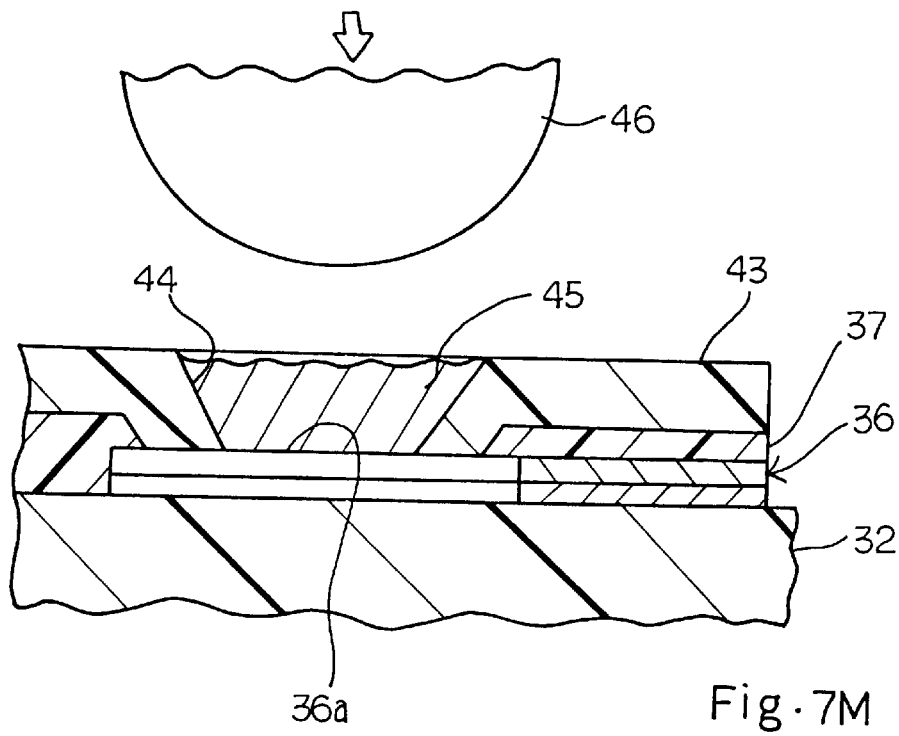
Figure 7N:
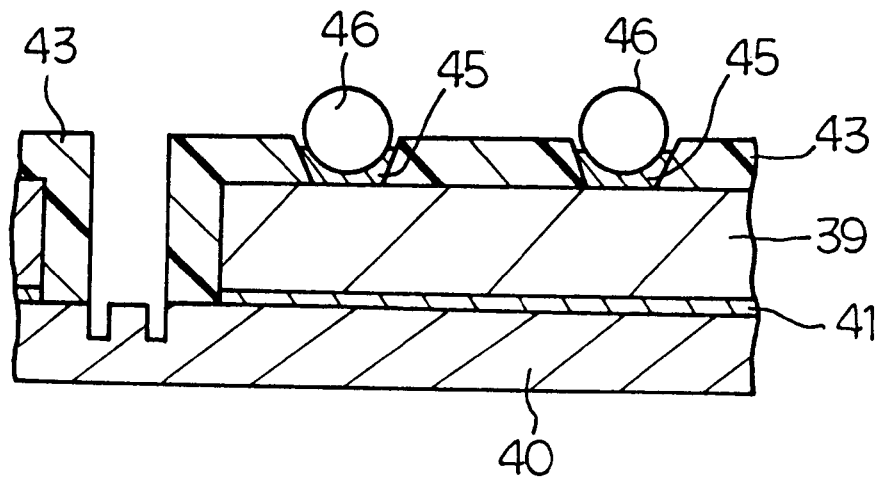
Figure 7O:
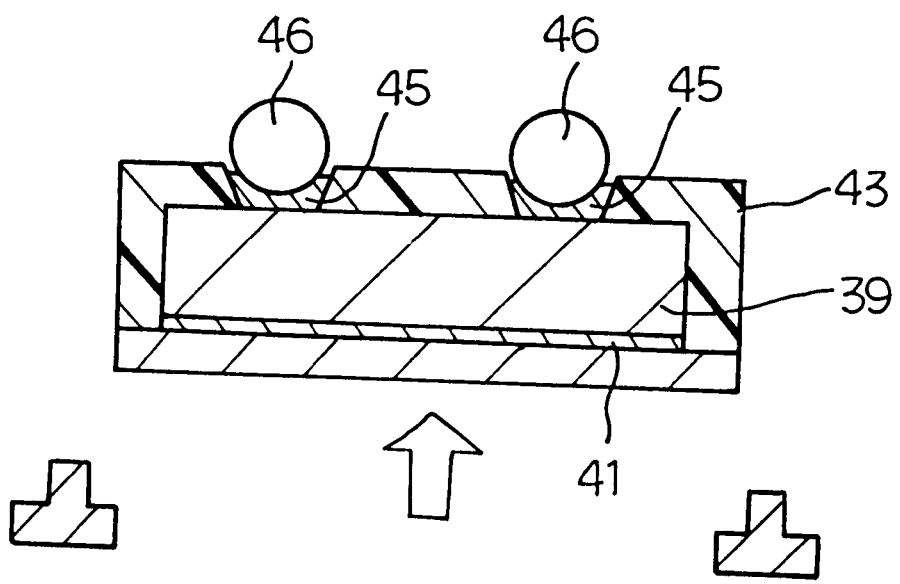

Solder 45 is supplied to the hole 44, and a solder ball 46 is inserted into the recess 44 as shown in FIG. 7M. The solder ball 46 is bonded to the land portion 36a by means of the solder 45. In this way, the solder balls 46 are provided in all the holes 44 as shown in FIG. 7N, and form the solder ball array. Finally, the lead frame 40 is cut, and is separated together with the semiconductor chip 39 as shown in FIG. 7O.

As will be understood from the foregoing description, the semiconductor integrated circuit device shown in FIG. 6 is fabricated through the process sequence.

Other Device Structures

Figure 8:
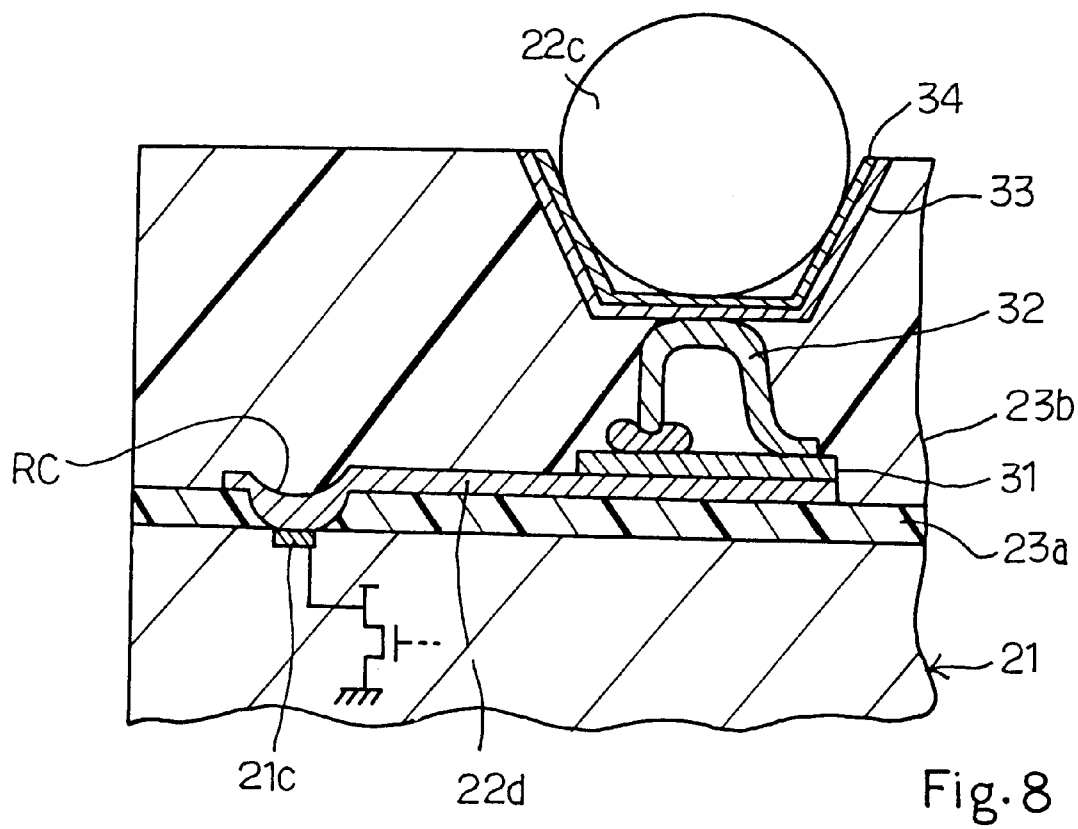
FIG. 8 is a cross sectional view showing the structure of another semiconductor integrated circuit device according to the present invention.

FIG. 8 illustrates another semiconductor integrated circuit device embodying the present invention. Layers and strips of the semiconductor integrated circuit device are labeled with the same references designating corresponding layers and corresponding strips of the semiconductor integrated circuit device shown in FIGS. 3 and 4 without detailed description.

A conductive layer 31 is plated on the contact portions of the conductive strips 22d/22e, and a conductive wire 32 is bonded at both ends thereof to the conductive layer 31. The conductive layer 31 is formed of silver, and the conductive wire 32 is partially lifted over the conductive layer 31. The conductive wire 32 may be formed as follows. First, a small ball is formed at the leading end of a conductive wire projected from a capillary (not shown), and the capillary goes down so as to press the small ball against the conductive layer 31. The small ball is fusion bonded to the conductive layer. Thereafter, the capillary goes up, and the conductive wire is drawn out from the capillary. The capillary clamps the conductive wire, and goes down so as to press the conductive wire against the conductive layer 31. The conductive wire is bonded to the conductive layer 31 again. The capillary goes up so as to tear off the conductive wire, and the conductive wire 32 is left on the conductive layer 31.

The conductive wire 32 is exposed to a recess formed in the stress relaxation layer 23b. The inner surface defining the recess is covered with noble metal such as, for example, palladium 33, and a solder layer 34 is laminated on the palladium layer 33. The palladium may be evaporated on the inner surface, and the palladium layer 33 may be plated with the solder layer 34. The solder ball 22c is received in the recess defined by the solder layer 34, and is bonded to the solder layer 34.

The conductive wire 32 allows the manufacturer to increase the thickness of the stress relaxation layer 23b, and the recess RC is never transferred to the upper surface of the stress relaxation layer 23b. The solder layer 34 is strongly bonded to the solder ball 22c, and the solder ball 22c is never separated from the semiconductor integrated circuit device.

Figure 9:
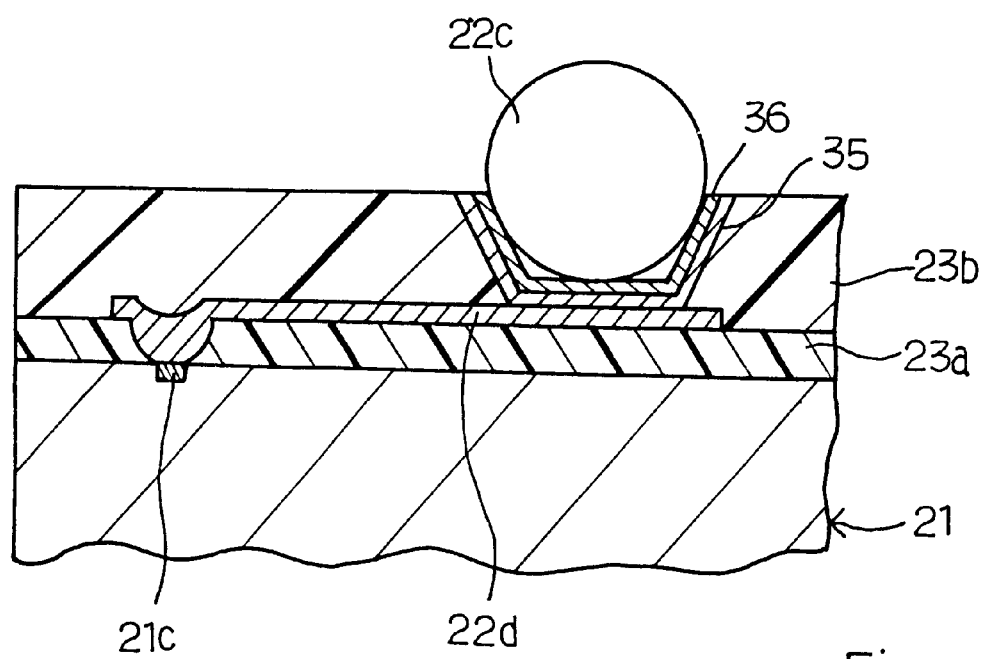
FIG. 9 is a cross sectional view showing the structure of yet another semiconductor integrated circuit device according to the present invention.

FIG. 9 illustrates yet another semiconductor integrated circuit device embodying the present invention. Layers and strips of the semiconductor integrated circuit device are labeled with the same references designating corresponding layers and corresponding strips of the semiconductor integrated circuit device shown in FIGS. 3 and 4 without detailed description.

The contact portions of the conductive strips 22d are exposed to recesses formed in the stress relaxation layer 23b, and are plated with silver layers. An inner surface defines the recess, and is covered with a noble metal layer 35 such as, for example, palladium by using the evaporation technique, and the noble metal layer 35 is plated with a solder layer 36. The solder ball 22c is received in the recess defined by the solder layer 36, and is strongly bonded to the solder layer 36.

The solder layer 36 increases the bonding strength to the solder ball 22c, and noble metal layers improves the ohmic contact.

Although particular embodiments of the present invention have been shown and described, it will be apparent to those skilled in the art that various changes and modifications may be made without departing from the spirit and scope of the present invention.

What is claimed is:

1. A semiconductor device comprising:
   a semiconductor chip having electric elements connected to conductive pads formed on a major surface thereof,
   an insulating layer covering said major surface and having holes to which said conductive pads are exposed,
   conductive strips formed on said insulating layer and having first portions respectively connected to said conductive pads,
   a stress relaxation layer thicker than said insulating layer, covering said conductive strips and having holes to which second portions of said conductive strips are exposed,
   solder balls received in said holes in said stress relaxation layer and soldered to said second portions, respectively, and
   a lifter provided between said second portion of said conductive strips and one of said solder balls for increasing the thickness of said stress relaxation layer, wherein said lifter is formed by a conductive wire bonded at both ends thereof to said second portion at a spacing in such a manner as to project an intermediate portion over said second portion.

2. The semiconductor device as set forth in claim 1, further comprising
   a noble metal layer covering an inner surface defining each recess formed in said stress relaxation layer and electrically connected to the second portion of one of said conductive strips, and
   a solder layer laminated on said noble metal layer and bonded to one of said solder balls.

3. The semiconductor device as set forth in claim 2, in which said protective insulating layer, said conductive strips and said noble metal layer are formed of polyimide, aluminum and palladium, respectively.

4. A semiconductor device comprising:
   a semiconductor chip having electric elements connected to conductive pads formed on a major surface thereof,
   an insulating layer covering said major surface and having holes to which said conductive pads are exposed,
   conductive strips formed on said insulating layer and having first portions respectively connected to said conductive pads,
   a stress relaxation layer thicker than said insulating layer, covering said conductive strips and having holes to which second portions of said conductive strips are exposed,
   solder balls received in said holes in said stress relaxation layer and soldered to said second portions, respectively, wherein said stress relaxation layer includes a covering layer formed so that said conductive strips are sandwiched between said insulating layer and said covering layer and a spacer layer is laminated on said covering layer.

5. The semiconductor device as set forth in claim 4, in which said insulating layer and said covering layer are formed of polyimide, and said spacer layer is formed of epoxy resin.

6. The semiconductor device as set forth in claim 5, in which said covering layer and said spacer layer are of the order of 10 microns thick and of the order of 100 microns thick, respectively.

* * * * *

UNITED STATES PATENT AND TRADEMARK OFFICE
CERTIFICATE OF CORRECTION

PATENT NO. : 5,962,918
DATED : October 5, 1999
INVENTOR(S) : Naoto KIMURA

It is certified that error appears in the above-identified patent and that said Letters Patent is hereby corrected as shown below:

On the title page, item

--[54] SEMICONDUCTOR DEVICE HAVING STRESS RELAXATION LAYER --.

Signed and Sealed this

Ninth Day of May, 2000

Attest:

Q. TODD DICKINSON

Attesting Officer

Director of Patents and Trademarks